United States Patent
Dillon

(10) Patent No.: US 6,650,263 B1
(45) Date of Patent: Nov. 18, 2003

(54) DIFFERENTIAL SAMPLER STRUCTURES WITH REDUCED DISTORTION AND CURRENT DEMAND

(75) Inventor: Christopher Daniel Dillon, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/288,318

(22) Filed: Nov. 4, 2002

(51) Int. Cl.[7] .............................. H03M 1/00; H03M 1/34
(52) U.S. Cl. .......................... 341/122; 341/162; 327/96
(58) Field of Search .................................. 341/122, 162, 341/135; 327/94, 96

(56) References Cited

U.S. PATENT DOCUMENTS 5,361,068 A * 11/1994 Llewellyn .................... 341/144
5,515,003 A    5/1996 Kimura ....................... 330/253
5,606,320 A    2/1997 Kleks ......................... 341/161
6,255,865 B1   7/2001 Opris ......................... 327/94
6,300,811 B1 * 10/2001 Dick .......................... 327/252
6,359,577 B1   3/2002 Weigel ........................ 341/147

OTHER PUBLICATIONS

US 2002/0093752; Pakriswamy et al. High Bandwidth low noise crosscoupled amplifier, Jul. 18, 2002.*

* cited by examiner

Primary Examiner—Peguy JeanPierre
(74) Attorney, Agent, or Firm—Koppel, Jacobs, Patrick & Heybl

(57) ABSTRACT

Differential sampler structures are provided that reduce signal distortion and current demand. The structures include first and second buffers that drive first and second capacitors and first and second switches. First and second current pumps are capacitively coupled and also cross coupled to the first and second capacitors relative to the coupling of the first and second buffers to these capacitors. As a result, signal distortion and current demand are both reduced.

23 Claims, 2 Drawing Sheets

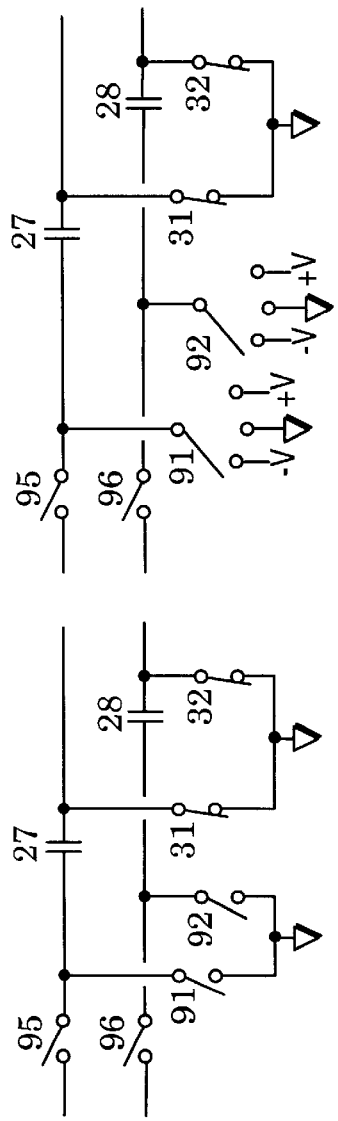
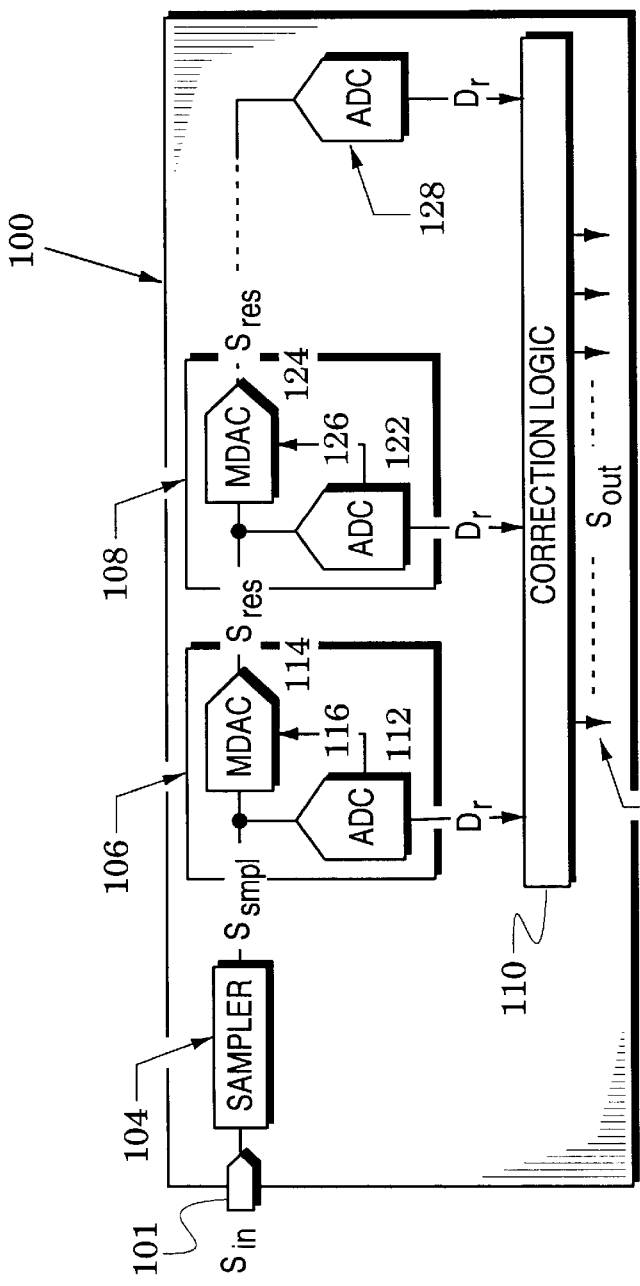

DIFFERENTIAL SAMPLER STRUCTURES WITH REDUCED DISTORTION AND CURRENT DEMAND

BACKGROUND OF THE INVENTION

1. Field of the Invention

The present invention relates generally to signal-conditioning systems and, more particularly, to samplers in these systems.

2. Description of the Related Art

Samplers are essential elements in a variety of signal-conditioning systems (e.g., analog-to-digital converters). Although sometimes referred to as track-and-holds, sample-and-holds and sample-hold amplifiers (SHAs), all samplers share the task of successively "freezing" a fast-moving input signal to provide samples that facilitate further processing in an associated signal-conditioning system. The rate and timing of the "freezing" or sampling is generally set by a system clock signal.

The input signal is typically stored on a capacitor which is decoupled from the input signal by a switch that responds to the clock signal. A buffer (i.e., a buffer stage or buffer amplifier) is generally inserted to pass the input signal to the capacitor and switch and thereby present a high impedance to the input-signal source and provide current gain to enhance signal drive of the capacitor.

Although the size of the capacitor is preferably reduced to limit the current required from the buffer, it must be large enough to generate sample amplitudes that will realize a desired signal-to-noise ratio at the sampler's output. The size of the capacitor cannot, therefore, be reduced below a limit capacitance $C_{lmt}$ that is set by the desired signal-to-noise ratio.

Accordingly, the buffer must provide currents to a capacitance at least equal to $C_{lmt}$ that are sufficiently large to achieve a slew rate across the corresponding capacitor that maintains fidelity of the samples. As the frequency of the input signal increases, this current demand also increases to offset the corresponding decrease of the capacitor's impedance. Insufficient current will fail to maintain the required slew rate (i.e., slew-rate limiting will occur) and will, therefore, generate distortion in the samples.

The buffer generally includes an emitter follower (or source follower) and an associated current source to bias the emitter follower. Even though the emitter follower may have sufficient current gain, insufficient current from the current source will cause current variations in the emitter follower which generate variations in its base-to-emitter voltage $V_{be}$ (or gate-to-source voltage $V_{gs}$). Because this voltage is in the signal path, these variations also generate distortion in the samples.

These sample distortion sources have typically been reduced by increasing the current of the current source but this has effects (e.g., degraded efficiency and increased heating) which are highly undesirable in modern signal-conditioning systems.

BRIEF SUMMARY OF THE INVENTION

The present invention is directed to differential sampler structures that reduce signal distortion and current demand.

These goals are realized with first and second buffers that drive first and second capacitors and first and second switches. First and second current pumps are capacitively coupled and also cross: coupled to the first and second capacitors relative to the coupling of the first and second buffers to these capacitors. Reduced signal distortion is obtained along with reduced current demand.

The novel features of the invention are set forth with particularity in the appended claims. The invention will be best understood from the following description when read in conjunction with the accompanying drawings.

BRIEF DESCRIPTION OF THE DRAWINGS

FIGS. 2A and 2B are schematics of different embodiments of the structure within the curved line 2 of FIG. 1; and FIG. 3 is a block diagram of an ADC system embodiment of the present invention that includes the sampler of FIG. 1.

DETAILED DESCRIPTION OF THE INVENTION

Figure 1:
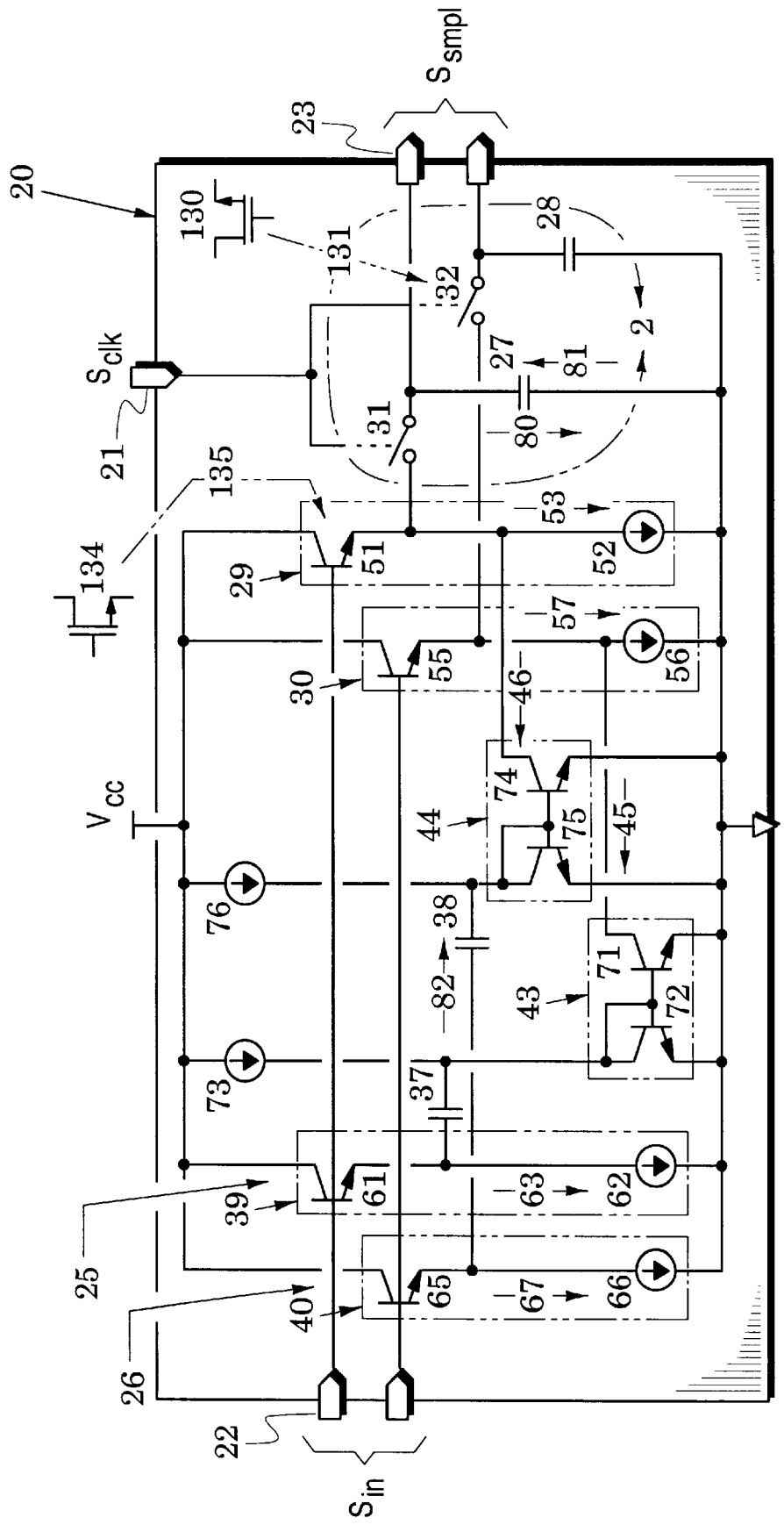
FIG. 1 is a schematic of a sampler embodiment of the present invention.

FIG. 1 illustrates a sampler embodiment 20 of the current invention. The sampler includes first and second switches that respond to a clock signal $S_{clk}$ at a clock port 21. The sampler further includes first and second sample capacitors and first and second buffers that respectively drive the first and second sample capacitors in response to a differential input signal $S_{in}$ at a differential input port 22.

In accordance with the invention, first and second current pumps 25 and 26 are capacitively coupled to respectively respond with the first and second buffers to the differential input signal $S_{in}$ and, in response, provide currents respectively to the second and first buffers. That is, the first and second current pumps 25 and 26 are cross coupled to the first and second switches relative to the coupling of the first and second buffers. This cross coupling reduces distortion and current demand.

In the sampler embodiment of FIG. 1, the first current pump 25 is formed with a first mimic buffer 39, a first mimic capacitor 37 and a first current mirror 43 that is coupled to the second buffer 30. The first current pump 25 thus responds to a first input portion of the differential input signal $S_{in}$ along with the first buffer 29 but is cross-coupled relative to the first buffer because its first current mirror 43 is: coupled to the second buffer 30.

Similarly, the second current pump 26 is formed with a second mimic buffer 40, a second mimic capacitor 38 and a second current mirror 44 that is coupled to the first buffer 29. The second current pump 26 thus responds to a second input portion of the differential input signal $S_{in}$ along with the second buffer 30 but is cross-coupled relative to the second buffer because its second current mirror 44 is coupled to the first buffer 29. The structure and operation of the first and second current pumps is included in the following general description.

In particular, first and second sample capacitors 27 and 28 are coupled to opposite sides of the differential output port 23. The inputs of first and second buffers 29 and 30 are coupled to respond to first and second portions of the differential input signal $S_{in}$ and coupled to respectively drive the first and second sample capacitors 27 and 28. First and second switches 31 and 32 are respectively serially-coupled with the first and second sample capacitors 27 and 28.

In addition, first and second mimic capacitors 37 and 38 are provided and first and second mimic buffers 39 and 40 are coupled to respectively respond with the first and second buffers 29 and 30 to the first and second portions of the differential input signal $S_{in}$. First and second current mirrors 43 and 44 are coupled to respectively provide currents 45 and 46 to the second and first buffers 30 and 29 and the first and second mimic capacitors 37 and 38 are respectively coupled between the first mimic buffer 39 and the first current mirror 43 and between the second mimic buffer 40 and the second current mirror 44. The first and second mimic capacitors 37 and 38 are thus arranged to respectively couple the first mimic buffer 39 to drive the first current mirror 43 and couple the second mimic buffer 40 to drive the second current; mirror 44.

In an embodiment of the invention, the first buffer 29 includes a first buffer transistor in the form of an emitter follower 51 and includes a first buffer current source 52 that is coupled to the follower's emitter to bias it with a current 53. Similarly, the second buffer 30 includes a second buffer transistor in the form of an emitter follower 55 and includes a second buffer current source 56 that is coupled to the follower's emitter to bias it with a current 57.

The first mimic buffer 39 includes a first mimic buffer transistor in the form of an emitter follower 61 and includes a first mimic buffer current source 62 that is coupled to the follower's emitter to bias it with a current 63. Similarly, the second mimic buffer 40 includes a second mimic buffer transistor in the form of an emitter follower 65 and includes a first mimic buffer current source 66 that is coupled to the follower's emitter to bias it with a current 67.

In an embodiment of the invention, the first current mirror 43 is formed of a transistor 71 that is connected to a diode-coupled transistor 72. The latter transistor is biased with a bias current source 73. The second current mirror 44 is formed of a transistor 74 that is connected to a diode-coupled transistor 75. The latter transistor is biased with a bias current source 76.

It is noted that emitter followers 51 and 61 respond to one side of the differential input signal $S_{in}$ and that emitter followers 55 and 65 respond to the other side. It is further noted that although the second current mirror 44 is coupled to the emitter of the emitter follower 51, this current mirror is driven by the emitter follower 65 (via the second mimic capacitor 38). Similarly, the first current mirror 43 is coupled to the emitter of the emitter follower 55 but this current mirror is driven by the emitter follower 61 (via the first mimic capacitor 37).

Thus, one side of the differential input signal $S_{in}$ is coupled to the the first buffer 29 and, via emitter follower 61, first mimic capacitor 37 and first current mirror 43, is coupled to the second buffer 30. Similarly, the other side of the differential input signal $S_{in}$ is coupled to the second buffer 30 and, via emitter follower 65, second mimic capacitor 38 and second current mirror 44, is coupled to the first buffer 29. In other words, relative to its direct coupling to the first and second buffers 29 and 30, the differential input signal $S_{in}$ is cross coupled to these same buffers via the first and second mimic buffers 39 and 40, the first and second mimic capacitors 37 and 38 and the first and second current mirrors 43 and 44.

In operation of the sampler 20, the emitter followers 51 and 55 are driven by the differential input signal $S_{in}$ at the input port 22 and it is initially assumed that the first and second switches 27 and 28 are closed. Typically, the differential input signal $S_{in}$ is rising at one follower and falling at the other at a first instant in time and then reversing at a later second instant in time.

If the differential input signal $S_{in}$ is rising at the emitter follower 51 at the first instant in time, this follower provides the current 53 of the current source 52 and also provides a charging current 80 to drive the first sample capacitor 27. When the differential input signal $S_{in}$ is subsequently falling at the emitter follower 51 at the second instant in time, the current 53 of the current source 52 must provide a discharging current 81 to drive the first sample capacitor 27 and provide the remainder of the current 53 to bias the emitter follower 51.

If the discharging current 81 is substantial, the remainder is insufficient and the bias current through the emitter follower 51 will substantially differ between the first and second instants in time. This current difference will cause the base-to-emitter voltage $V_{be}$ of the emitter follower 51 to substantially differ and, since $V_{be}$ is in the signal path, there will be a substantial distortion between the signal stored on the first sample capacitor 27 and its corresponding portion of the differential input signal $S_{in}$.

The operational description to this point applies to processes in conventional samplers. It is noted, however, that the differential input signal $S_{in}$ is rising at the second mimic buffer 40 at the second instant in time. In accordance with the invention, this signal rise causes the second mimic buffer 40 to drive a current 82 through the second mimic capacitor 38 and this current is mirrored by the second current mirror 44 to the emitter side of the emitter follower 51.

A small portion of the mirrored current 45 corresponds to the mirror's bias current from its bias current source 73 but the major portion is the mirrored product of the current 82 and this portion offsets the current difference in the emitter follower 51 that was described above. Thus, the bias current difference and the (resulting) $V_{be}$ difference in the emitter follower 51 are substantially reduced. Accordingly, the distortion in the signal stored on the first sample capacitor 27 is also substantially reduced (i.e., its fidelity is enhanced).

Although the above operational description was directed to the emitter follower 51 of the first buffer 39, it is apparent that a similar portion of the current 46 through the first current mirror 43 offsets current differences in the emitter follower 55 this offset substantially reduces distortion in the signal stored on the second sample capacitor 28.

As the frequency of the differential input signal $S_{in}$ increases, the amplitude of the charging and discharging currents (e.g., charging and discharging currents 80 and 81) that are required to faithfully follow the input signal also increase because the impedances of the first and second sample capacitors 27 and 28 decrease. Accordingly, the first and second mimic buffers 39 and 40 are coupled to their respective current mirrors 43 and 44 by the first and second mimic capacitors 37 and 38 whose impedances also decrease as the frequency of the differential input signal $S_{in}$ increases.

As more charging and discharging current is demanded by the increased frequency, the currents through the first and second mimic capacitors 37 and 38 (e.g., the current 82) increase and this increase is mirrored as an increase in the currents 45 and 46 which supplement the currents 53 and 57 of the sample current sources 52 and 56. Thus the slew rate capability of the sampler 20 is substantially enhanced at higher frequencies and signal distortion due to slew-rate limiting is substantially reduced.

In conventional samplers, the signal distortions described above ($V_{be}$ variation and slew-rate limiting) are typically reduced by substantially increasing the currents 53 and 57 of the current sources 52 and 56 of the first and second buffers 29 and 30. This distortion resolution, however, increases current demand which has serious negative consequences (e.g., decreased efficiency and increased heating).

In contrast, the sampler embodiments of the invention permit the currents 53 and 57 of the buffer current sources 52 and 56 to be substantially reduced because they need only supply sufficient currents to reduce signal distortion at low frequencies of the differential input signal $S_{in}$.

The current mirrors 43 and 44 are preferably configured to have a current gain of N. For example, the transistor 71 is configured to have a device size N times greater than the device size of the diode-coupled transistor 72. The mirrored currents 45 and 46 will, therefore, be quite large even though the current sources 62 and 66 that respectively bias the emitter followers 61 and 65 (in the mimic buffers 39 and 40) are substantially reduced to limit current consumption at low frequencies of the differential input signal $S_{in}$. The bias current sources 73 and 76 can also be substantially reduced because they need only bias the diode-coupled transistors 72 and 75 at low frequencies.

In an exemplary sampler embodiment, the current gain of the current mirrors 43 and 44 is N, the capacitance of the mimic capacitors 37 and 38 is 1/N of the capacitance of the sample capacitors 27 and 28 and the current sources 62 and 66 provide bias currents that are 1/N that of the bias currents of the current sources 52 and 56 and, in addition, N is sufficiently high (e.g., at least 4) to significantly reduce current demand at low frequencies of the differential input signal $S_{in}$. Thus, the sampler 20 of FIG. 1 will reduce signal distortion (e.g., distortions due to $V_{be}$ variation and slew-rate limiting) while also reducing current demand (and thus increasing efficiency and reducing heating).

The sampler of FIG. 1 positions the first and second switches 31 and 32 between the first and second buffers 29 and 30 and the first and second sample capacitors 27 and 28. Samples $S_{smpl}$ are provided at the differential output port 23 when the first and second switches open in response to the clock signal $S_{clk}$ at the clock port 21. The advantages of the sampler 20 of FIG. 1 can also be realized in a variety of other sampler structures that are exemplified in FIGS. 2A and 2B which illustrate different embodiments of the structure within the curved line 2 of FIG. 1.

A different output arrangement is shown in FIG. 2A in which the first and second sample capacitors 27 and 28 are positioned between the first and second buffers 29 and 30 and the first and second switches 31 and 32. Additional switches 91 and 92 couple the top plates of the first and second sample capacitors 27 and 28 to ground. In this sampler arrangement, the first and second sample capacitors 27 and 28 obtain sample charges when all switches are in the state shown in FIG. 2A. When the first and second switches 31 and 32 are subsequently opened and the switches 91 and 92 closed, the sample charges are transferred to downstream circuits (e.g., a differential amplifier) because both top and bottom plates of the first and second sample capacitors now have the same ground potential.

In the output arrangements of FIGS. 1 and 2A, it is noted that the first and second switches 31 and 32 are respectively serially coupled with the first and second sample capacitors 27 and 28 to facilitate charging of these capacitors. However, the arrangement of FIG. 2A makes the bottom plates of the first and second switches available so that their charges can be subsequently transferred downstream. During this transfer, the first and second buffers (29 and 30 in FIG. 1) must be decoupled which is accomplished by decoupling switches 95 and 96 in FIG. 2A.

Another output arrangement is shown in FIG. 2B which is similar to FIG. 2A with like elements indicated by like reference numbers. When the first and second switches 31 and 32 are subsequently opened in FIG. 2B, the top plates of the first and second sample capacitors can be switched through the switches 91 and 92 to various different potentials (e.g., +V, ground and −V). A voltage in a downstream circuit (e.g., a differential amplifier) may now be offset as desired. A sampler with this offsetting feature is generally referred to as a multiplying digital-to-analog converter (MDAC). It should be apparent, however, that this arrangement is simply another sampler embodiment of the invention.

The sampler structures of the present invention can advantageously be used as samplers and MDACs in a variety of signal conditioning systems such as the pipelined ADC 100 of FIG. 3. The ADC 100 includes a sampler 104, an initial converter stage 106 and at least one successive converter stage 108 and converts an analog input signal $S_{in}$ at an input port 101 to a corresponding digital output signal $S_{out}$ at an output port 102.

In particular, the sampler 104 provides a sample signal $S_{smpl}$ in response to the input signal $S_{in}$ and the initial converter stage 106 processes the sample signal $S_{smpl}$ to provide a residue signal $S_{res}$ and also provide respective digital bits $D_r$. In a similar fashion, each successive converter stage 108 processes a preceding residue signal $S_{res}$ to provide a successive residue signal $S_{res}$ and also provide respective digital bits $D_r$. However, the final one of the successive converter stage only provides respective digital bits $D_r$. The converter stages of the pipelined ADC 100 generally provide extra digital bits so that the pipelined ADC can include a correction logic 110 which corrects processing errors and generates the digital output signal $S_{out}$.

The initial converter stage 106 typically has an ADC 112 (e.g., a flash ADC) that converts the sample signal $S_{smpl}$ to respective digital bits $D_r$. The initial converter stage also has an MDAC 114 that receives the sample signal $S_{smpl}$ and also receives a decision signal 116 from the ADC 112. The decision signal indicates which of the respective digital bits $D_r$ is being provided at any given moment by the ADC 112. Although each of the successive converter stages 108 processes a preceding residue signal $S_{res}$ (rather than the sample signal $S_{smpl}$), they are configured similarly to the initial converter stage 106. The successive converter stage 108, for example, has an ADC 122, an MDAC 124 and receives a decision signal 126 from the ADC 122. In contrast, the final converter stage is formed with an ADC 128.

The switches (e.g., 31 and 32 in FIG. 1) of the invention are preferably realized with transistors that respond to the clock signal $S_{clk}$ such as the exemplary common-gate stage 130 that is inserted for the switch 32 as indicated by insertion arrow 131 in FIG. 1.

Although sampler embodiments of the invention have been described broadly with references to generic transistors, the drawings have, for clarity of illustration, indicated specific transistor types (e.g., bipolar junction transistors and metal-oxide-semiconductor (MOS) transistors). It is noted, however, that the teachings of the invention can generally be practiced with various transistor types. As an example, the emitter follower 51 of FIG. 1 may be replaced with a source follower 134 as indicated by replacement arrow 135.

To enhance description of the invention, elements of the first and second pumps 25 and 26 (e.g., first and second mimic buffers 39 and 40) have been chosen to include the word mimic because they resemble or closely imitate other sampler structures (e.g., first and second buffers 29 and 30).

Embodiments of the invention have generally been referred to as samplers but the structures and teachings of the invention are, in general, suited for driving capacitive loads with low distortion in response to high-bandwidth input signals. In many applications (e.g., ones requiring high linearity and large capacitive loads), open-loop differential drivers of the invention will provide better performance (e.g., in speed and stability) than typical closed-loop amplifiers.

An exemplary open-loop differential driver of the invention is formed by removing the first and second capacitors 27 and 28 and the first and second switches 31 and 32 from FIG. 1. The remaining elements define a differential driver in which first and second buffers 29 and 30 respectively drive first and second output sides of the differential output port 23 in respective response to first and second input portions of the differential input signal $S_{in}$.

FIG. 1 shows that these buffers are complemented by first and second capacitively-coupled current pumps 25 and 26 that respectively provide currents to the second and first output sides in respective response to the first and second input portions. The current pumps 25 and 26 are thus capacitively coupled and, in addition, they are cross-coupled relative to the first and second buffers 29 and 30.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A differential driver that drives first and second output sides of a differential output port in response to first and second input portions of a differential input signal, comprising:

first and second buffers that respectively drive said first and second output sides in respective response to said first and second input portions; and first and second capacitively-coupled current pumps that respectively provide currents to said second and first output sides in respective response to said first and second input portions.

2. The sampler of claim 1, wherein said first current pump includes:

a first mimic buffer that responds to said first current portion;

a first current mirror that mirrors current to said second buffer; and a first mimic capacitor that couples said first mimic buffer to drive said first current mirror;

and wherein said second current pump includes:

a second mimic buffer that responds to said second current portion;

a second current mirror that mirrors current to said second buffer; and a second mimic capacitor that couples said second mimic buffer to drive said second current mirror.

3. The sampler of claim 2, wherein said first and second current mirrors have current gains greater than one and said first and second mimic capacitors are respectively smaller than said first and second sample capacitors.

4. The sampler of claim 2, wherein said first mimic buffer includes:

a first mimic buffer transistor; and a first mimic buffer current source that biases said first mimic buffer transistor;

and wherein said second mimic buffer includes:

a second mimic buffer transistor; and a second mimic buffer current source that biases said second mimic buffer transistor.

5. The sampler of claim 4, wherein said first and second mimic buffer transistors are bipolar junction transistors.

6. The sampler of claim 4, wherein said first and second mimic buffer transistors are complementary metal-oxide-semiconductor (CMOS) transistors.

7. The sampler of claim 1, wherein said first buffer includes:

a first buffer transistors; and a first buffer current source that biases said first buffer transistor;

and wherein said second buffer includes:

a second buffer transistors; and a second buffer current source that biases said second buffer transistor.

8. The sampler of claim 7, wherein said first and second buffer transistors are bipolar junction transistors.

9. The sampler of claim 7, wherein said first and second buffer transistors are complementary metal-oxide-semiconductor (CMOS) transistors.

10. The driver of claim 1, wherein said first buffer includes:

a first buffer transistors; and a first buffer current source that biases said first buffer transistor;

and wherein said second buffer includes:

a second buffer transistors; and a second buffer current source that biases said second buffer transistor.

11. The driver of claim 10, wherein said first and second buffer transistors are bipolar junction transistors.

12. The driver of claim 10, wherein said first and second buffer transistors are complementary metal-oxide-semiconductor (CMOS) transistors.

13. A sampler that provides samples of a differential input signal in response to a command signal, comprising:

first and second sample capacitors;

first and second buffers that respectively drive said first and second sample capacitors in response to said differential input signal;

first and second switches that respond to said command signal and are respectively serially-coupled with said first and second sample capacitors; and first and second current pumps that are capacitively coupled to respectively respond with said first and second buffers to said differential input signal and, in response, provide currents respectively to said second and first buffers.

14. The driver of claim 13, wherein said first and second current pumps include:

a first mimic buffer that responds with said first buffer to said differential input signal;

a first current mirror that mirrors current to said second buffer; and a first mimic capacitor that couples said first mimic buffer to drive said first current mirror;

and wherein said second current pump includes:

a second mimic buffer that responds with said second buffer to said differential input signal;

a second current mirror that mirrors current to said second buffer; and a second mimic capacitor that couples said second mimic buffer to drive said second current mirror.

15. The driver of claim 14, wherein said first and second current mirrors have current gains greater than one and said first and second mimic capacitors are respectively smaller than said first and second sample capacitors.

16. The driver of claim 14, wherein said first mimic buffer includes:
   a first mimic buffer transistor; and
   a first mimic buffer current source that biases said first mimic buffer transistor;
   and wherein said second mimic buffer includes:
      a second mimic buffer transistor; and
      a second mimic buffer current source that biases said second mimic buffer transistor.

17. The driver of claim 16, wherein said first and second mimic buffer transistors are bipolar junction transistors.

18. The driver of claim 16, wherein said first and second mimic buffer transistors are complementary metal-oxide-semiconductor (CMOS) transistors.

19. The driver of claim 13, wherein:
   said first switch is positioned between said first buffer and said first sample capacitor; and
   said second switch is positioned between said second buffer and said second sample capacitor.

20. The driver of claim 13, wherein:
   said first sample capacitor is positioned between said first buffer and said first switch; and
   said second sample capacitor is positioned between said second buffer and said second switch.

21. A pipelined analog-to-digital converter that processes a differential input signal to a corresponding digital signal, comprising:
   an initial converter stage that processes samples of said differential input signal to provide a residue signal and respective bits of said digital signal;
   at least one successive converter stage that processes a preceding residue signal to provide a successive residue signal and respective bits of said digital signal wherein a final converter stage only provides said respective bits; and
   at least one sampler that is positioned in said initial converter stage and includes:
      a) first and second sample capacitors;
      b) first and second buffers that respectively drive said first and second sample capacitors in response to said differential input signal;
      c) first and second switches that respond to said command signal and are respectively serially-coupled with said first and second sample capacitors;
      d) first and second mimic buffers that are coupled to respectively respond with said first and second buffers to said differential input signal;
      e) first and second current mirrors coupled to mirror current respectively to said second and first buffers; and
      f) first and second mimic capacitors that respectively couple said first mimic buffer to drive said first current mirror and couple said second mimic buffer to drive said second current mirror.

22. The converter of claim 21, wherein:
   said first sample capacitor is positioned between said first switch and said first buffer; and
   said second sample capacitor is positioned between said second switch and said second buffer.

23. The sampler of claim 21, wherein said first and second current mirrors have current gain greater than one and said first and second mimic capacitors are respectively smaller than said first and second sample capacitors.

* * * * *